(12) United States Patent
Nakamura

(10) Patent No.: US 6,483,652 B2
(45) Date of Patent: Nov. 19, 2002

(54) METHOD FOR PRODUCING SOLID-STATE IMAGING DEVICE

(75) Inventor: Masao Nakamura, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/931,975

(22) Filed: Aug. 16, 2001

(65) Prior Publication Data

US 2002/0034022 A1 Mar. 21, 2002

(30) Foreign Application Priority Data

Aug. 17, 2000 (JP) .......................... 2000-247884

(51) Int. Cl.⁷ ........................ G02B 7/02; H04N 5/225
(52) U.S. Cl. .................. 359/819; 359/809; 348/340
(58) Field of Search .................. 359/808, 809, 359/822, 811, 819; 348/340, 355

(56) References Cited

U.S. PATENT DOCUMENTS 4,896,217 A * 1/1990 Miyazawa et al. .......... 348/340
5,673,083 A * 9/1997 Izumi et al. ................. 348/340
6,266,197 B1 * 7/2001 Glenn et al. ................. 359/819

FOREIGN PATENT DOCUMENTS

JP          10-301009          11/1998

* cited by examiner

Primary Examiner—Georgia Epps
Assistant Examiner—Saeed Seyrafi
(74) Attorney, Agent, or Firm—Edwards & Angell, LLP

(57) ABSTRACT

A method for producing a solid-state imaging device includes: a first step of mounting a solid-state imaging element on a transparent substrate having a first surface and a second surface opposite to the first surface such that a light receiving surface of the solid-state imaging element is substantially parallel to the first surface and faces the second surface; and a second step of forming a lens holder on the first surface, the lens holder having a lens mounting surface substantially parallel to the first surface.

10 Claims, 16 Drawing Sheets

METHOD FOR PRODUCING SOLID-STATE IMAGING DEVICE

BACKGROUND OF THE INVENTION

1. Field of the Invention

The present invention relates to a method for producing an imaging device with an integral lens including an optical lens and a solid-state imaging element.

2. Description of the Related Art

FIG. 17A is a schematic exploded perspective view showing a structure of a conventional solid-state imaging device with an integral lens. FIG. 17B is a cross-sectional view of the conventional solid-state imaging device with an integral lens shown in FIG. 17A taken along line A–A' of FIG. 17A. This solid-state imaging device is conventionally produced as follows. In a first step, a die bond is applied to a supporting mount 101 which is generally referred to as a package, and then a solid-state imaging element 102 is die bond-mounted on the package 101. In a second step, leads 103 provided on the package 101 are connected to electric signal I/O terminals (not shown) of the solid-state imaging element 102 by a wire bond. In a third step, recess portions 105 provided in a cylindrical member 104 of the package 101 are engaged with projecting members 108 provided on a support member 107 for supporting a lens 106. The support member 107 is moved toward the package 101 along an axis X and then turned about the axis X, so that the lens 106 is attached to the package 101. In order to achieve higher airtightness, an O-ring 109 may be provided between the support member 107 and the package 101. Such a solid-state imaging device with an integral lens is disclosed in, for example, Japanese Laid-Open publication No. 10-301009.

A solid-state imaging device receives light which has passed through an optical lens at a light receiving surface of a solid-state imaging element and outputs an image obtained at the light receiving surface as an electric signal. In order to obtain a satisfactory image, an optical axis of the light incident on the light receiving surface should not deviate from a vertical axis of the light receiving surface.

Referring to FIGS. 18A to 18E, a problem of a conventional method for producing a solid-state imaging device will be described below.

In the above-described conventional art, in order to mount the solid-state imaging element 102 on the package 101, the solid-state imaging element 102 is required to be bonded to the package 101 as shown in FIG. 18A. The parallelism of the package 101 and the solid-state imaging element 102 depends on: (i) the parallelism of a surface which is in contact with a die bonding stage (not shown), i.e., a bottom surface of the package 101 (shown as face C in FIG. 18B), and a bonding tool (not shown); and (ii) a quantity and position of a die bond 110 which is applied to a bonding surface (shown as face B in FIG. 18B) of the package 101. Therefore, in practice, there is great difficulty in placing a light receiving surface 111 (shown as face A in FIG. 18B) of the solid-state imaging element 102 in parallel with the bonding surface (face B) and the bottom surface (face C) of the package 101 with high precision.

There is a slight deviation from a vertical axis of the light receiving surface 111 due to tolerance included in each of the angles formed by: an internal surface (shown as face D in FIG. 18C) of the cylindrical member 104 of the package 101 in which a lens is attached and the bonding surface (face B shown in FIG. 18C) of solid-state imaging element 102; and a side surface (shown as face E in FIG. 18D) of the support member 107 and a center of the lens 112 (in a height direction).

When all these members are combined together, there arises a problem that an angle formed (denoted as F in FIG. 18E) by an optical axis 113 of the light passing through the lens 106 and the light receiving surface 111 of the solid-state imaging element 102 is deviated from the right angle.

SUMMARY OF THE INVENTION

According to the present invention, there is provided a method for producing a solid-state imaging device which includes: a first step of mounting a solid-state imaging element on a transparent substrate having a first surface and a second surface opposite to the first surface such that a light receiving surface of the solid-state imaging element is substantially parallel to the first surface and faces the second surface; and a second step of forming a lens holder on the first surface, the lens holder having a lens mounting surface substantially parallel to the first surface.

According to the above method of the present invention, a light receiving-surface of the solid-state imaging element is formed on the second surface of the transparent substrate having the first surface (light receiving surface) and the second surface. The lens is mounted and fixed on the lens mounting surface of the lens holder which is formed on the first surface (light receiving surface) of the transparent substrate. As a result, an angle of an optical axis of light incident on the first surface (light receiving surface) can be prevented from being deviated from an right angle.

In one embodiment of the present invention, the first step is performed by an ultrasonic wave connection technique.

According to the above method of the present invention, high throughput can be achieved even when a low temperature connection is used.

In one embodiment of the invention, the second step is performed by injecting resin into a mold.

According to the above method of the present invention, the lens holder is directly formed on the transparent substrate, thereby providing a smaller solid-state imaging device.

In one embodiment of the invention, the lens holder is formed integrally with a package.

According to the above method of the present invention, the lens holder and the package can be integrally formed, thereby producing a solid-state imaging device with an integral lens at low cost by using a small number of parts.

In one embodiment of the invention, the first surface of the transparent substrate is adsorbed airtight to the mold by vacuum suction.

According to the above method of the present invention, the transparent substrate can be fixed. A degree of vacuum can be measured before injecting the resin. Thus, a degree of inclination of the light receiving surface of the transparent substrate can be determined based on the degree of vacuum, thereby preventing defective molding of the solid-state imaging device. Moreover, there is a vacuum hole for vacuum suction formed in the lower mold, and a cavity is formed in the lens holder so that light passes therethrough.

In one embodiment of the invention, an O-ring is placed in the mold so as to be in contact with the mold and the first surface of the transparent substrate before injecting the resin into the mold.

According to the above method of the present invention, in the case where the vacuum hole is formed in the lower mold, even when the contact area between the transparent substrate and the lower mold is not sufficiently large, higher airtightness between the lower mold and the transparent substrate can be achieved to prevent resin flow.

In one embodiment of the invention, the method for producing a solid-state imaging device further includes the step of covering the solid-state imaging element with a resin between the first step and the second step.

According to the above method of the present invention, the airtightness between the solid-state imaging element and the transparent substrate can be secured for resin molding performed later.

In one embodiment of the invention, the method for producing a solid-state imaging device further includes the step of attaching leads for input and output of an electric signal to the transparent substrate between the first step and the second step.

In one embodiment of the invention, the method for producing a solid-state imaging device further includes the step of attaching leads for input and output of an electric signal to the transparent substrate after the step of covering the solid-state imaging element with the resin but before the step of performing the second step.

According to the above method of the present invention, leads having a desired shape can be provided to the solid-state imaging device, thereby facilitating the mounting of the solid-state imaging device on other devices.

In one embodiment of the invention, the transparent substrate is an optical filter.

According to the above method of the present invention, a solid-state imaging device using an optical filter can be produced.

Thus, the invention described herein makes possible the advantage of providing a method for producing a solid-state imaging device which can be easily produced and can prevent a shift in an angle formed by a light receiving surface of a solid-state imaging element and an optical axis of light incident on the light receiving surface through an optical lens so as to obtain a satisfactory image.

This and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the drawings.

Figure 1A:
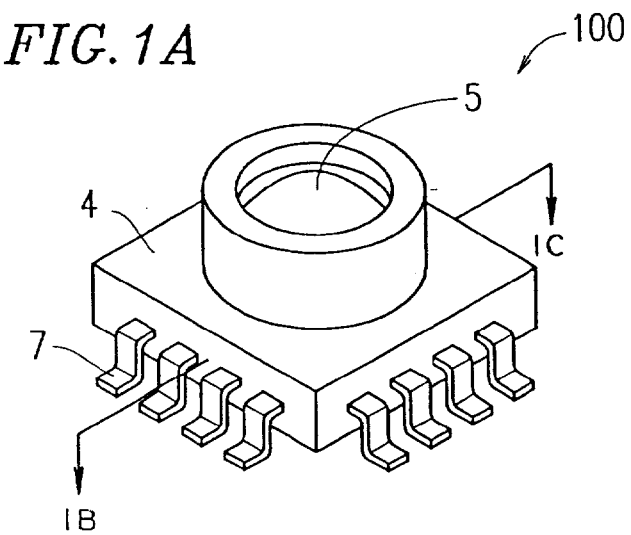
FIG. 1A is a schematic perspective view showing a structure of a solid-state imaging device which is produced according to an embodiment of the present invention.
Figure 1B:
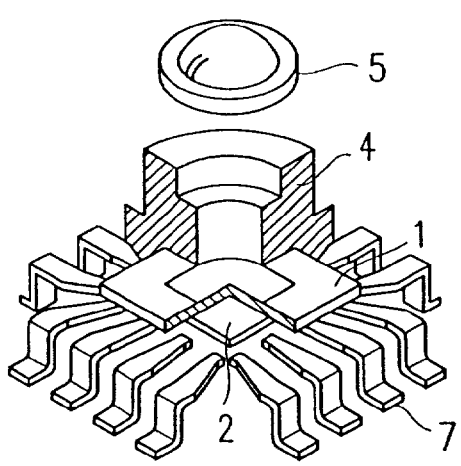
FIG. 1B is a schematic exploded perspective view showing the solid-state imaging device which is produced according to an embodiment of the present invention.
Figure 1C:
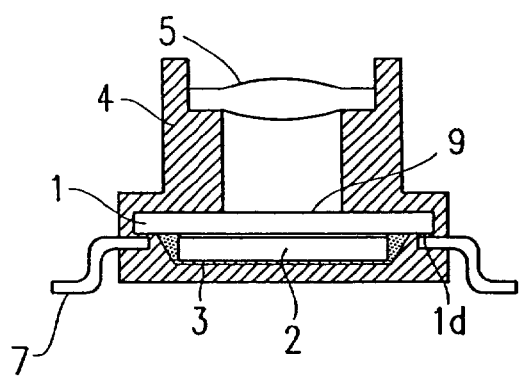
FIG. 1C is a cross-sectional view of the solid-state imaging device shown in FIG. 1A taken along line B–B'.

FIG. 1A is a schematic perspective view showing a structure of a solid-state imaging device 100 which is produced according to an embodiment of the present invention. FIG. 1B is a schematic exploded perspective view showing the solid-state imaging device 100 which is produced according to an embodiment of the present invention. FIG. 1C is a cross-sectional view of the solid-state imaging device 100 taken along line B–B' of FIG. 1A.

Figure 2:
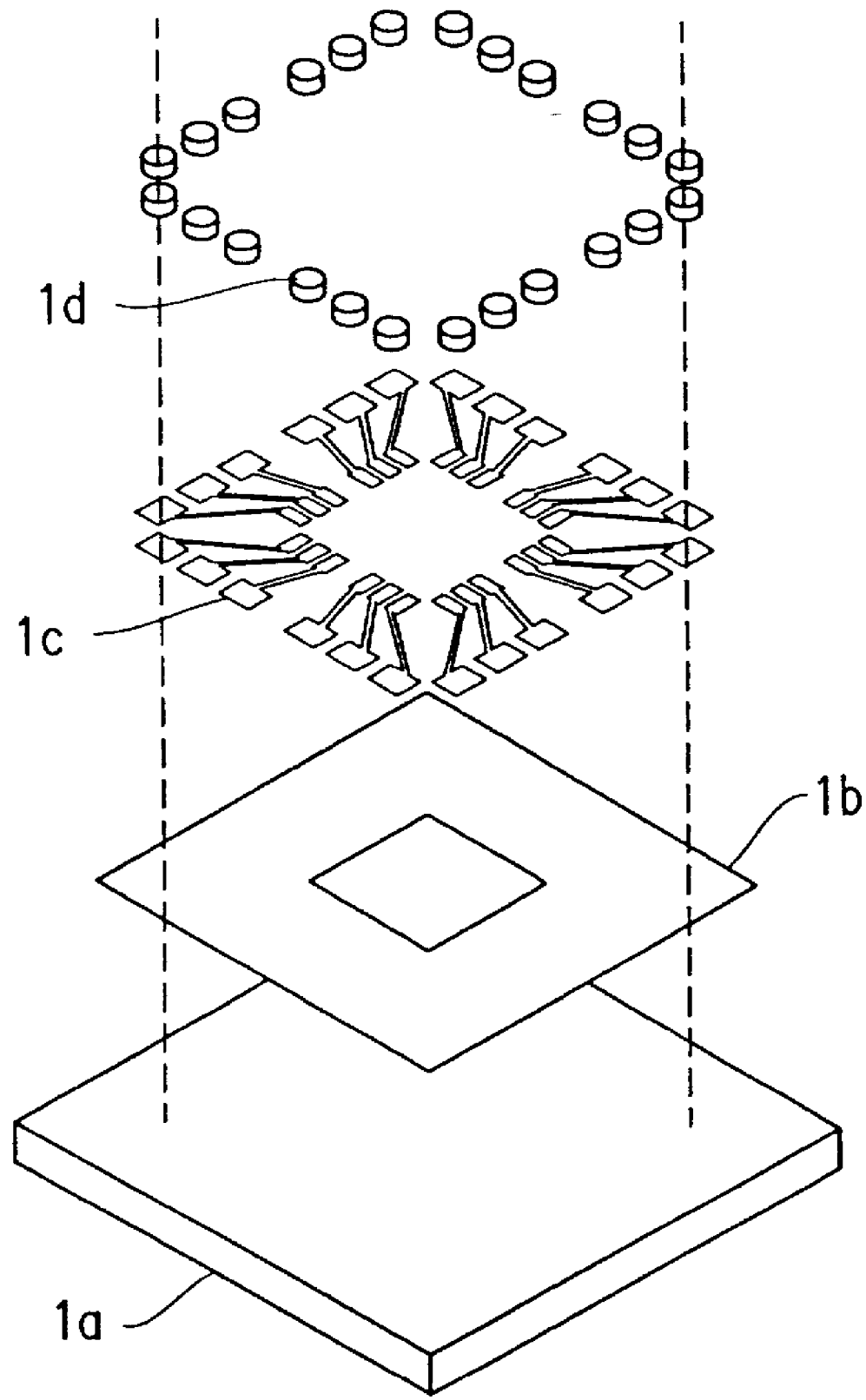
FIG. 2 is an exploded perspective view illustrating a production step of the solid-state imaging device shown in FIG. 1A.

The solid-state imaging device 100 includes a transparent substrate 1 having a first surface (light receiving surface 9) and a second surface opposite to the first surface, and a solid-state imaging element 2. The solid-state imaging element 2 is mounted on the transparent substrate 1 so as to face the second surface of the transparent substrate 1 and is covered with a thermosetting resin 3 over side and bottom surfaces thereof. The transparent substrate 1 includes wires lo (FIG. 2). The first surface of the transparent substrate 1 is provided with a resin mold package and lens holder 4, and a lens 5 is attached to a lens attachment face of the lens holder 4. The transparent substrate 1 has protruding electrodes 1d at an outer periphery of the second surface. The protruding electrodes 1d are connected to leads 7 used for inputting and outputting electric signals. The transparent substrate 1 may be an optical filter.

The solid-state imaging device 100 can be produced, for example, in a manner described below.

Referring to FIG. 2, an insulating film 1b of $SiO_2$ or the like is formed on a transparent substrate 1a formed of glass or the like having a thickness of about 0.5 mm to about 0.7 mm by using a CVD or sputtering method. The insulating film 1b is formed in an area of a transparent substrate 1a excluding an area corresponding to a light receiving area of a solid-state imaging element of the solid-state imaging device 100 to be formed. The wires 1c are formed on the insulating film 1b by forming a film of metal material, such as Al or the like, by a sputtering method and processing the resultant film. The protruding electrodes 1d are formed on an outer periphery of the wires 1c above the transparent substrate 1a for connecting the transparent substrate 1 to a lead frame described below. The protruding electrodes 1d may be either of Au-plated bumps formed by plating or Au bumps formed from an Au wire. Thus, the transparent substrate 1 is formed.

Figure 3:
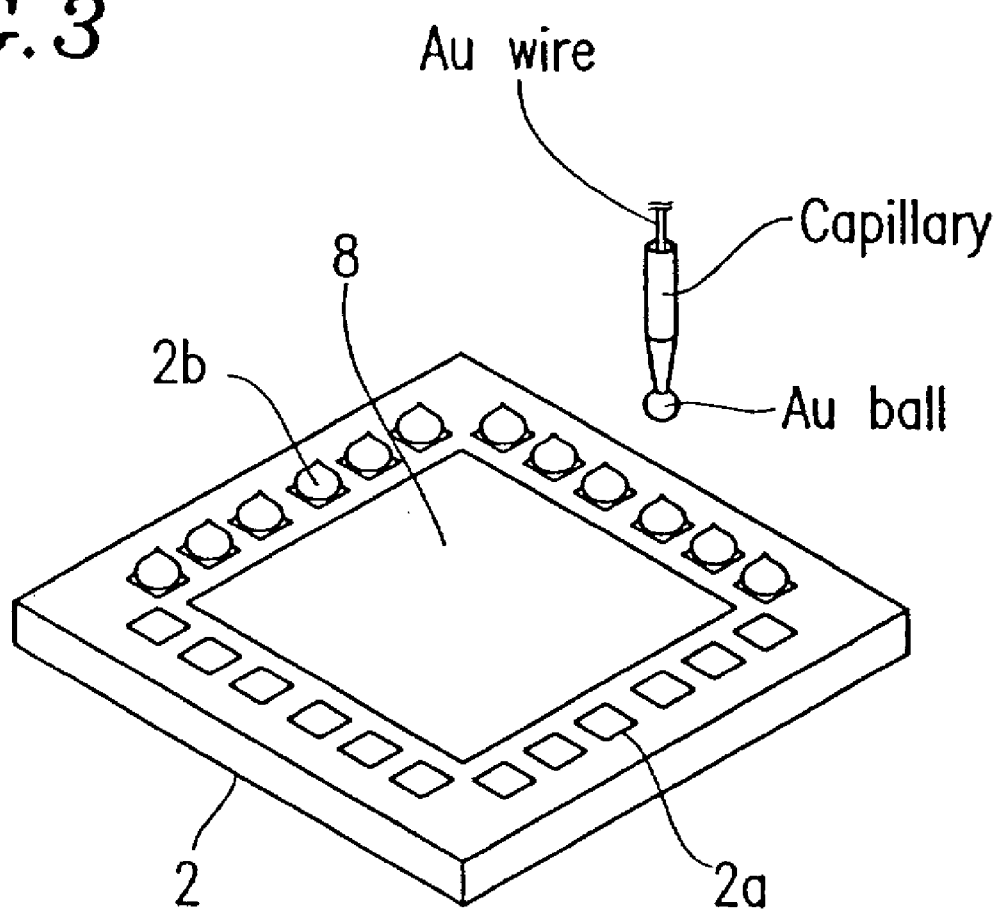
FIG. 3 is a perspective view illustrating a production step of the solid-state imaging device shown in FIG. 1A.

Referring to FIG. 3, external I/O terminals 2a used for inputting and outputting electric signals are provided around a light receiving surface 8 of the solid-state imaging element 2.

Protruding electrodes 2b, which are Au wire bumps, are formed on the external I/O terminals 2a by bonding. Au balls are formed from an Au wire in a capillary and placed as the Au bumps on the external I/O terminals 2a. The protruding electrodes 2b are required to be plastically deformed for joining the solid-state imaging element 2 to the wires 1c of the transparent substrate 1. Therefore, the protruding electrodes 2b are formed to have a height (20 $\mu$m to 30 $\mu$m) which is greater than that of a microlens (not shown) provided on the light receiving surface 8 of the solid-state imaging element 2.

Figure 4A:
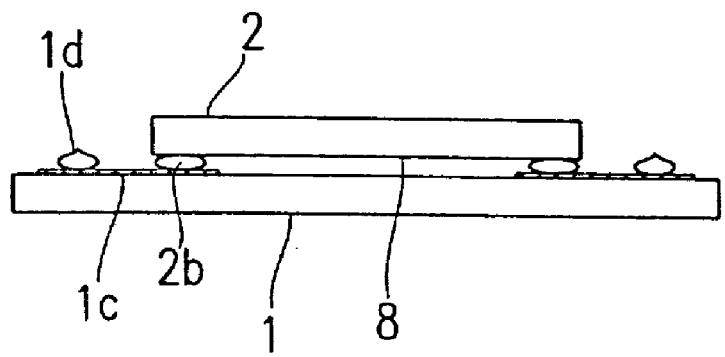
FIG. 4A is a cross-sectional view illustrating a production step of the solid-state imaging device shown in FIG. 1A.

Referring to FIG. 4A, the solid-state imaging element 2 is mounted on the wires 1c of the transparent substrate 1. The solid-state imaging element 2 is mounted such that the light receiving surface 8 thereof faces the surface of the transparent substrate 1 having the wires 1c (face down mounting). Thus, alloy junctioning of the protruding electrodes 2b of the solid-state imaging element 2 with the wires 1c of the transparent substrate 1 is performed. In this process, an ultrasonic wave connection technique can be used to achieve higher throughput at a lower temperature. For example, the wires 1c of the transparent substrate 1 can be formed of aluminum having a relatively high diffusion coefficient so as to allow the junction to be facilitated at a low temperature of about 120° C. at most. An alloy can be formed only by applying ultrasonic waves to complete the junction, and thus high throughput can be achieved.

Figure 4B:
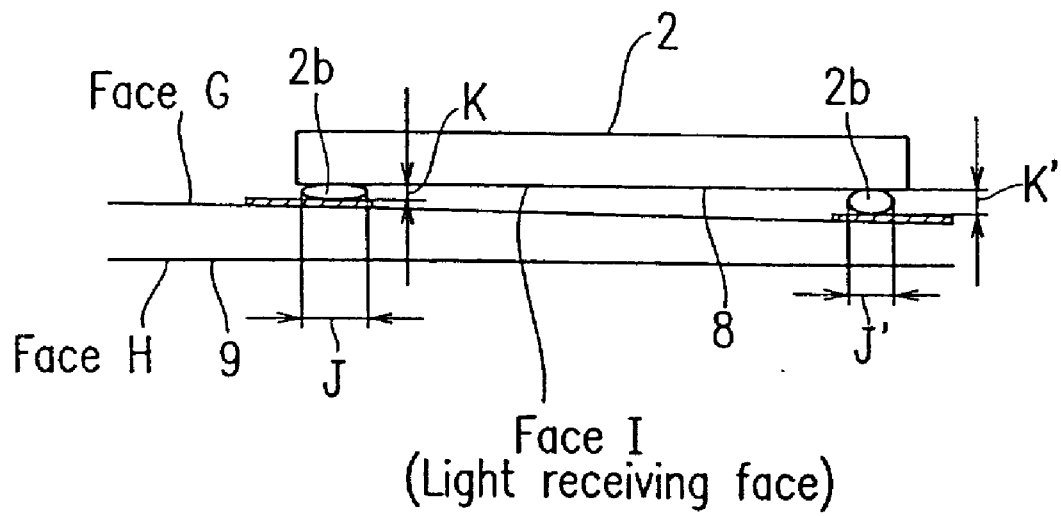
FIG. 4B is a cross-sectional view illustrating that parallelism of a light receiving surface of a transparent substrate and a light receiving surface of a solid-state imaging element is obtained by the present invention.

Referring to FIG. 4B, even when face H and face G of the transparent substrate 1 are not parallel to each other, the parallelism of a light receiving surface 9 of the transparent substrate 1 (face H) and the light receiving surface 8 (shown as face I) of the solid-state imaging element 2 is secured so long as a bonding stage and a bonding tool (not shown) are parallel to each other for the following reason. The Au wire bumps (the protruding electrodes 2b) formed in the preceding process are deformed (as shown by J and J', and K and K') under a thrust weight of 50 g to 100 g per bump applied during the application of the ultrasonic waves. As a result, the parallelism of a surface which is in contact with the bonding stage, i.e., the light receiving surface 9 of the transparent substrate 1 (face H), and the light receiving surface 8 (face I) of the solid-state imaging element 2 is secured with high precision.

Figure 5:
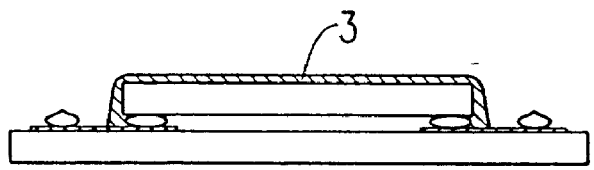
FIG. 5 is a cross-sectional view illustrating a production step of the solid-state imaging element shown in FIG. 1A.

Referring to FIG. 5, a thermosetting resin 3 is applied to side and bottom surfaces of the solid-state imaging element 2 and is cured by heating. The reason for applying the thermosetting resin 3 to the solid-state imaging element 2 is to secure the airtightness between the solid-state imaging element 2 and the transparent substrate 1 for resin molding performed later. A thixotropic resin having high viscosity of about 200 Pa•s to about 300 Pa•s can be used as the thermosetting resin 3 to control the quantity of resin 3 which goes into the gap between the solid-state imaging element 2 and the transparent substrate 1.

Figure 6:
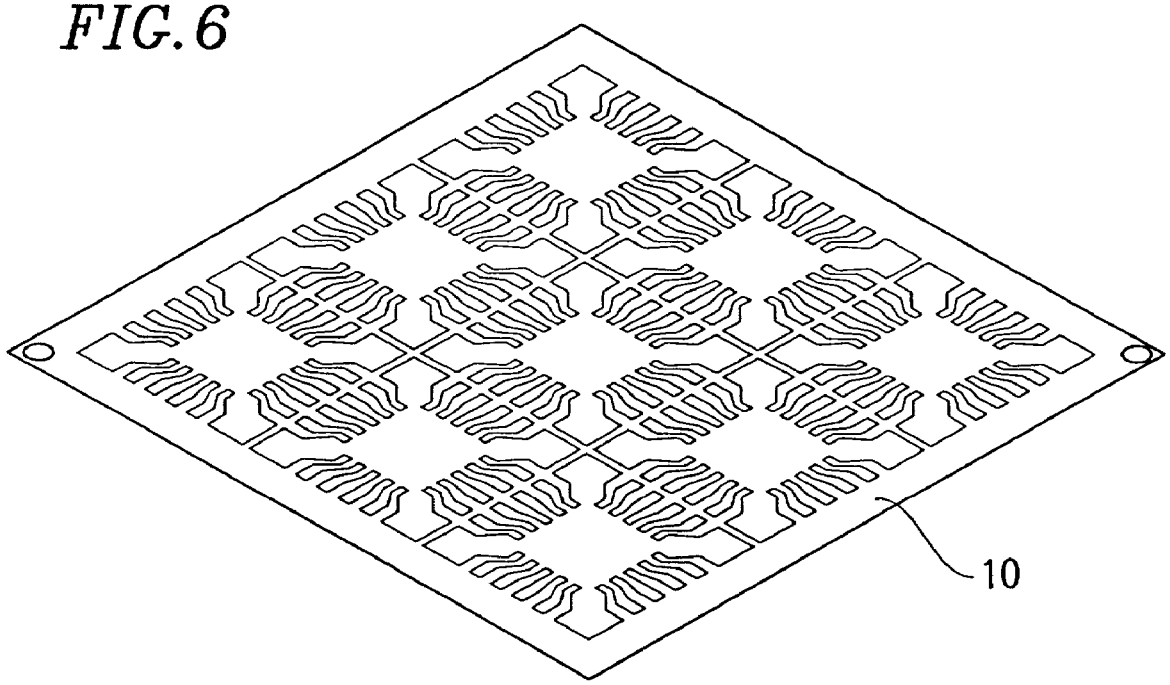
FIG. 6 is a perspective view illustrating a shape of a lead frame usable in the solid-state imaging device shown in FIG. 1A.

Next, the leads 7 (FIGS. 1A, 1B and 1C) are connected for inputting and outputting electric signals to and from an external device. Referring to FIG. 6, a lead frame 10 including inner leads arranged in a matrix, which are connected by tie bars, is prepared. The lead frame 10 has a thickness of about 80 $\mu$m to about 130 $\mu$m and is mainly formed of Cu. The lead frame 10 is plated with Au after being undercoated with Pd or plated with Ag after being undercoated with Ni only in portions which will be in contact with the protruding electrodes 1d (FIG. 2). In the present embodiment, since the lead frame 10 is connected to a plurality of transparent substrates 1 with the solid-state imaging elements 2 mounted thereon by an ultrasonic wave connection technique, the Au or Ag plated layer is required to have a thickness which is sufficiently thick for use in bond plating (about 1 $\mu$m).

Figure 7:
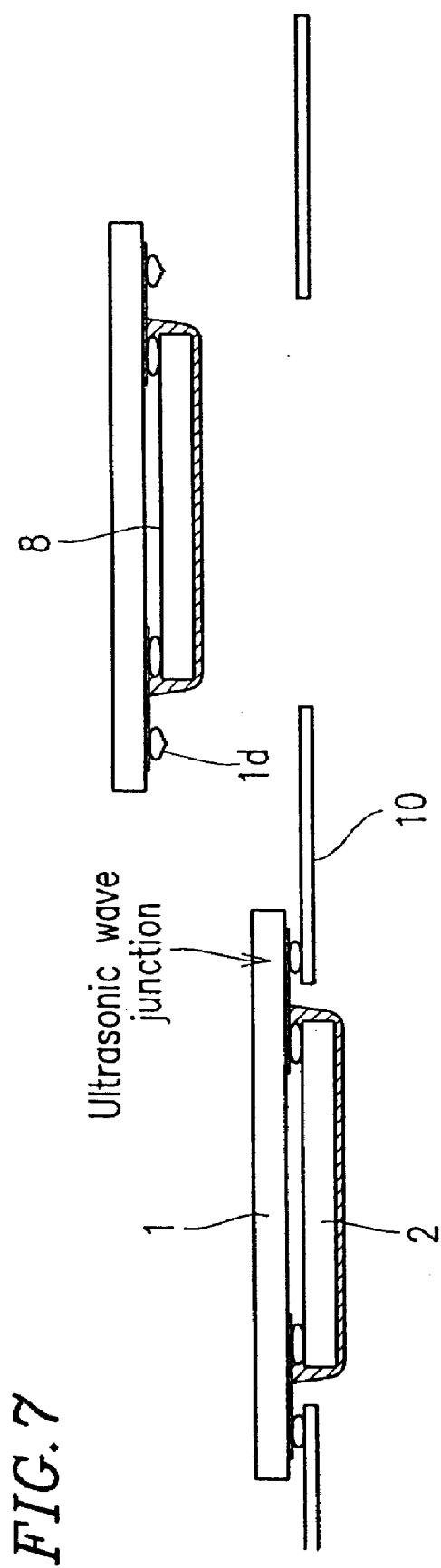
FIG. 7 is a cross-sectional view illustrating a production step of the solid-state imaging device shown in FIG. 1A.

FIG. 7 is a cross-sectional view illustrating a production step of the solid-state imaging device 100, in which two exemplary transparent substrates 1 before and after being mounted on the lead frame 10 are shown. In practice, as shown in FIG. 7, when the transparent substrate 1 is mounted such that the light receiving surface 8 of the solid-state imaging element 2 faces upward (face up mounting), the protruding electrodes 1d face downwards. The protruding electrodes 1d are placed in contact with the Au- or Ag-plated portions of the lead frame 10 and are joined to the lead frame 10 by applying ultrasonic waves under a thrust weight. Since this process uses an ultrasonic connection technique, the junction processes are performed in a consistent manner, and thus the investment in production facilities can be kept low.

Figure 8:
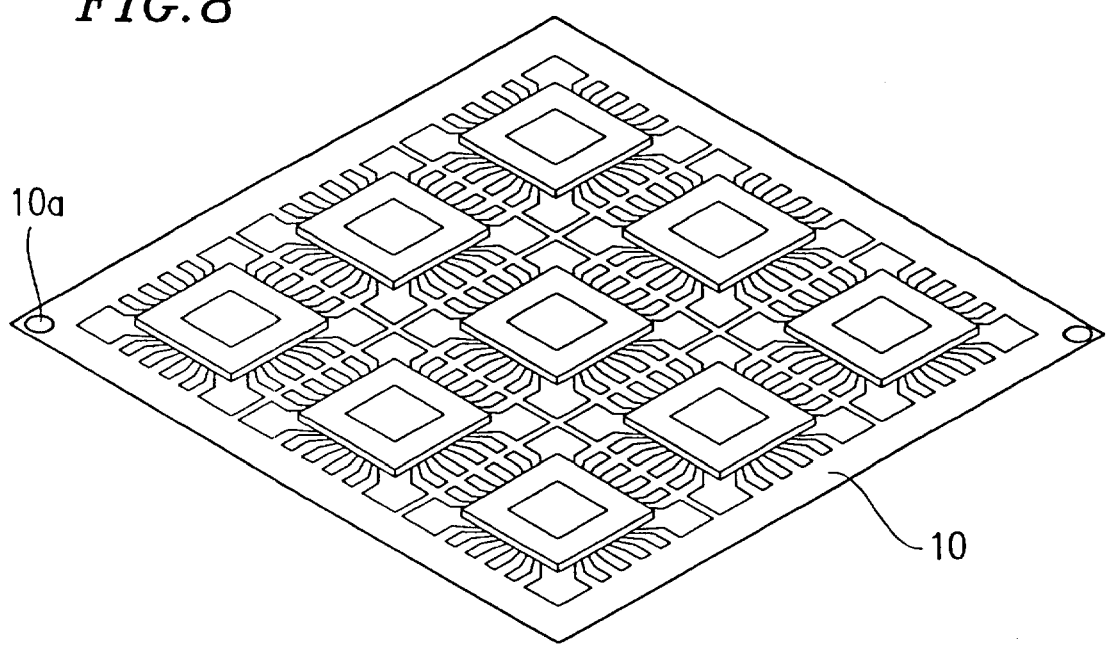
FIG. 8 is a perspective view illustrating alignment holes in a lead frame of the solid-state imaging device shown in FIG. 1A.
Figure 9:
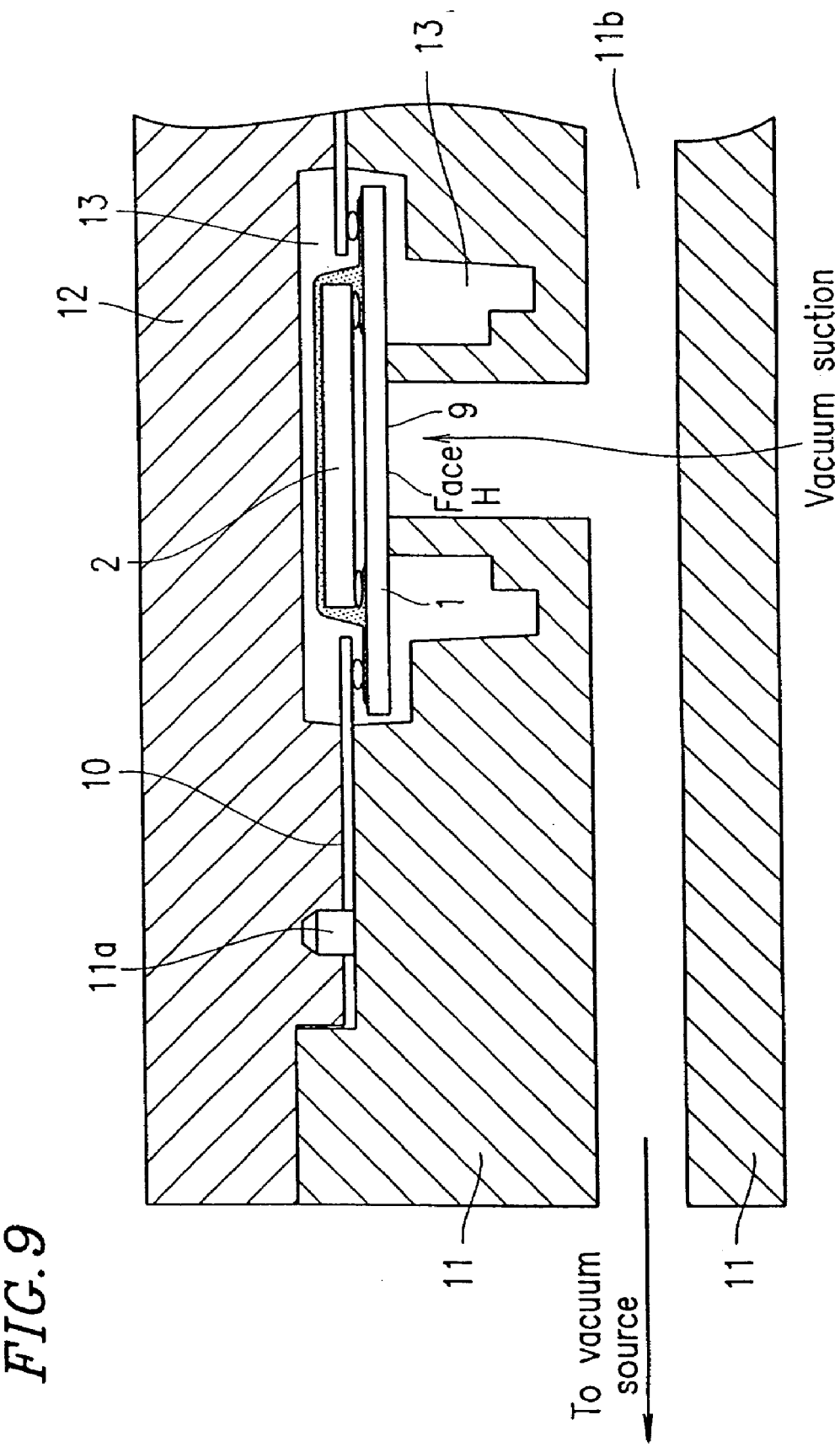
FIG. 9 is a cross-sectional view illustrating a production step of the solid-state imaging device shown in FIG. 1A.

Next, referring to FIG. 9, the lead frame 10 on which the substrates 1 having the solid-state imaging elements 2 mounted thereon are mounted is placed between an upper mold 12 and a lower mold 11. A thermosetting resin is injected into a space between the molds (resin filling space 13) to form an integral package and lens holder. It is preferable to use metal molds. Referring to FIGS. 8 and 9, alignment pins 11a provided on a lower mold 11 (FIG. 9) can be placed into alignment holes 10a provided in the lead frame 10 (FIG. 8), thereby appropriately positioning the lead frame 10 in an assembly of the upper mold 12 and the lower mold 11.

Moreover, as shown in FIG. 9, a vacuum hole 11b is formed in the lower mold 11. After the lead frame 10 is mounted on the lower mold 11, the light receiving surface 9 (shown as face H in FIG. 9) of the transparent substrate 1 is adsorbed downward by evacuating air through the vacuum hole 11b at about 20 kPs for each transparent substrate 1. As a result, the transparent substrate 1 is fixed onto the lower mold 11. Moreover, there is the vacuum hole 11b for vacuum suction formed in the lower mold 11, and a cavity is formed in the lens holder 4 so that light passes therethrough.

A degree of vacuum can be measured before injecting the resin so as to determine a state of each transparent substrate 1 having the solid-state imaging element 2 mounted thereon which is mounted on the lead frame 10. For example, when the degree of vacuum is not high enough, the light receiving surface 9 (face H) of the transparent substrate 1 is not determined to be parallel to the light receiving surface 8 (face I) (FIG. 4B) In this manner, it is possible to prevent defective molding of the solid-state imaging device 100.

Figure 10:
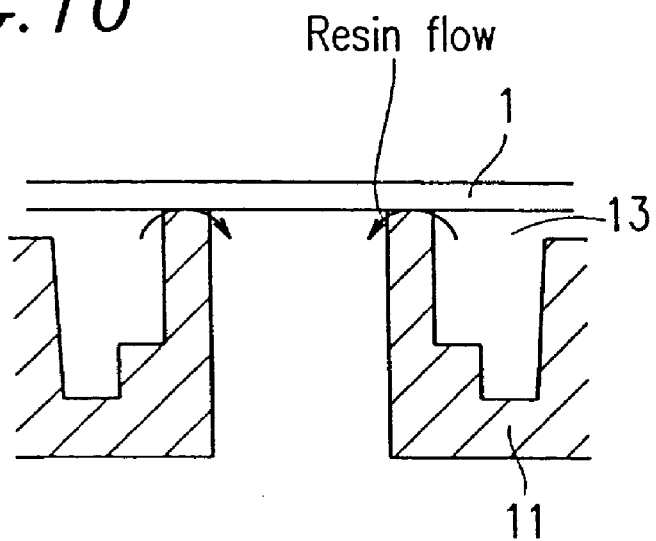
FIG. 10 is a cross-sectional view illustrating a resin flow which can occur in the solid-state imaging device shown in FIG. 1A.
Figure 11:
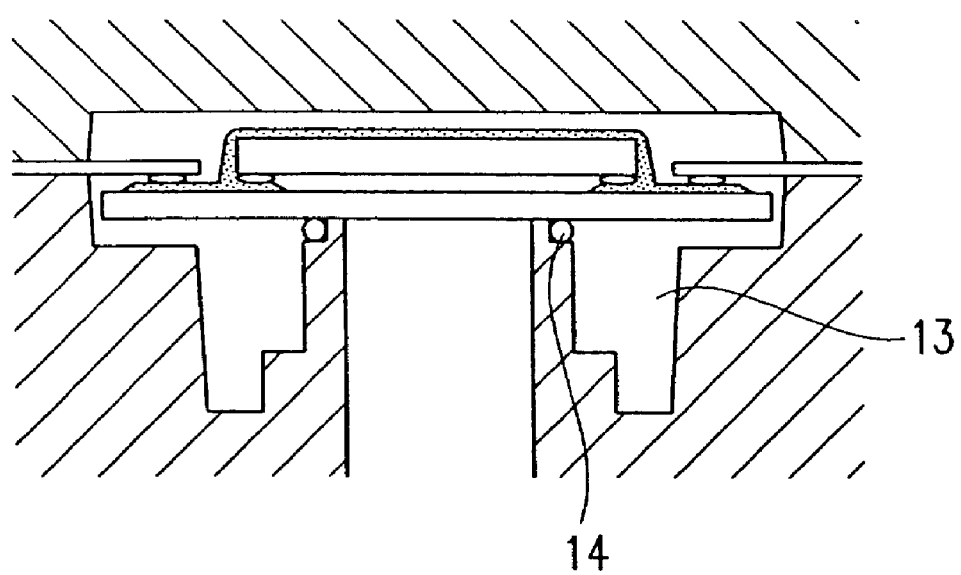
FIG. 11 is a cross-sectional view illustrating a production step of a solid-state imaging device according to another embodiment of the present invention.

In the case where the contact area between the transparent substrate 1 and the lower mold 11 is not sufficiently large, there is an undesirable possibility that, as shown in FIG. 10, when the resin is injected into a resin filling space 13, the resin may flow between the transparent substrate 1 and the lower mold 11, as indicated by the arrows. In order to prevent this, an O-ring 14 is placed in contact with the lower mold 11 and the light receiving surface 9 of the transparent substrate 1 as shown in FIG. 11. Thus, higher airtightness can be achieved between the lower mold 11 and the transparent substrate 1. The O-ring 14 is placed in each resin filling space 13 before the lead frame 10 is set on the lower mold 11.

Figure 12A:
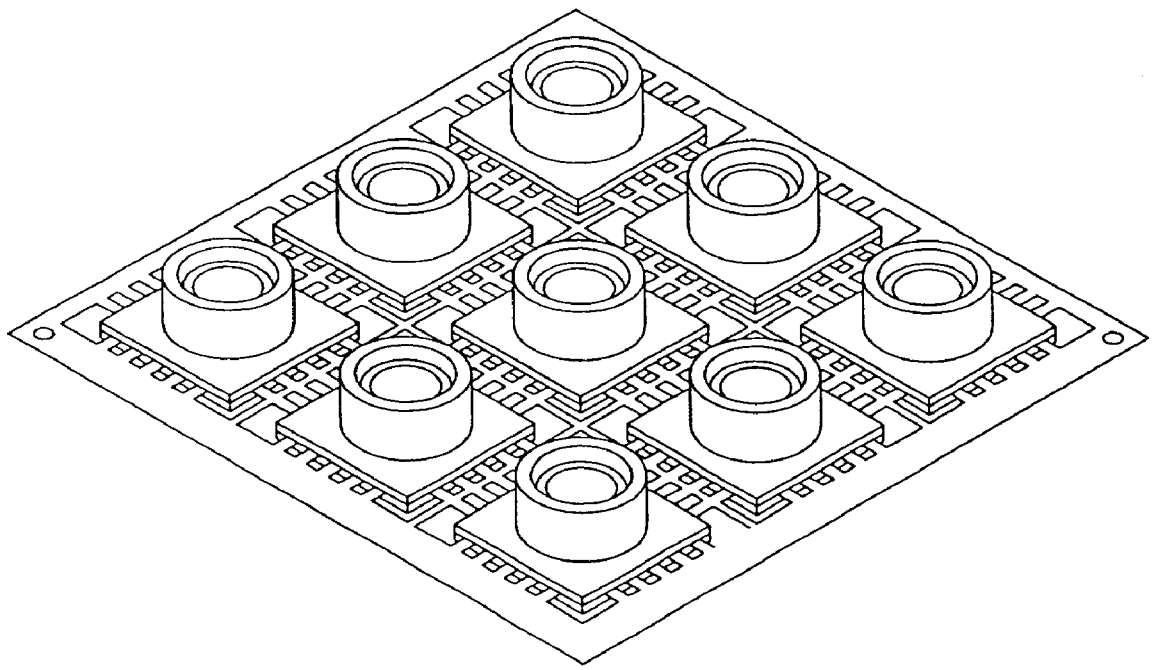
FIG. 12A is a perspective view illustrating a production step of the solid-state imaging device shown in FIG. 1A.
Figure 12B:
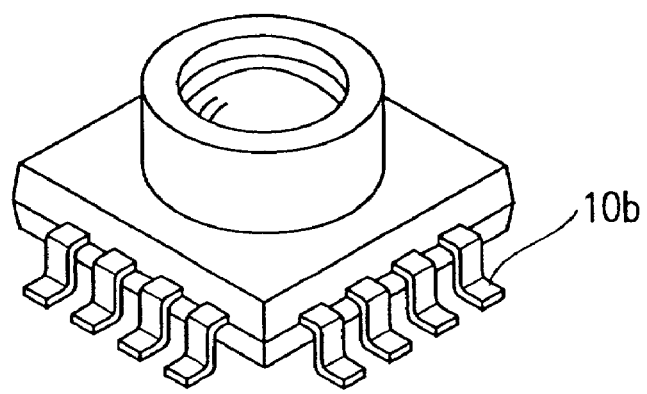
FIG. 12B is a perspective view illustrating a production step of the solid-state imaging device shown in FIG. 1A.

Next, as shown in FIG. 12A, the-molding product is divided into individual pieces each including an integral package and lens holder. Then, as shown in FIG. 12B, lead portions sticking out of the periphery of the package (frame cut portions 10 b) are bent.

Figure 13:
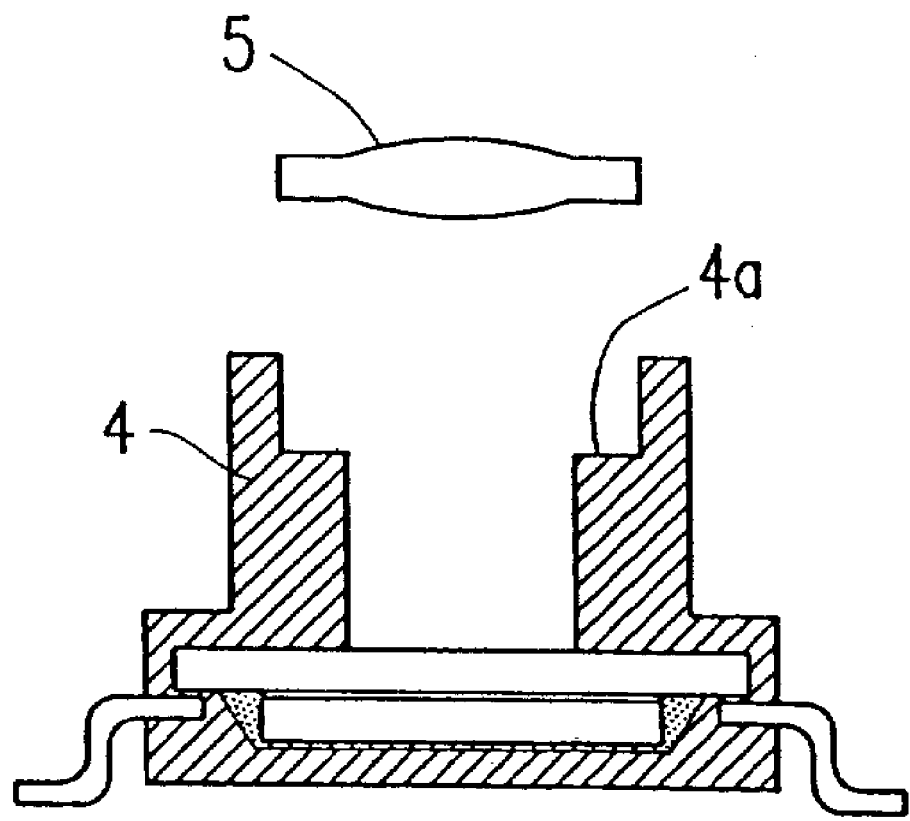
FIG. 13 is a cross-sectional view illustrating a production step of the solid-state imaging device shown in FIG. 1A.

Referring to FIG. 13, a lens 5 is mounted on a lens mounting surface 4a of the lens holder 4. Exemplary methods for fixing the lens 5 on the lens mounting surface 4a are shown in FIGS. 14A, 14B and 14C.

Figure 14A:
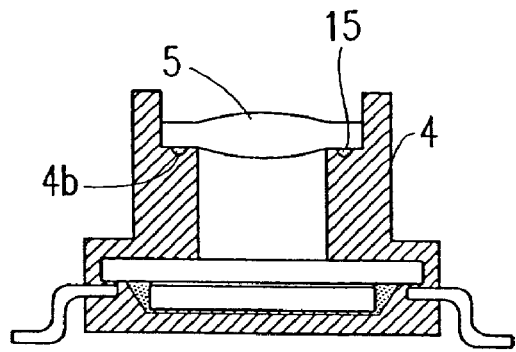
FIGS. 14A, 14B and 14C are each a cross-sectional view illustrating an example of a lens fixing method according to the present invention.

FIG. 14A shows a first exemplary method in which a U-shaped trench 4b is formed in the lens mounting surface 4a of the lens holder 4 and an adhesive 15 is injected into the U-shaped trench 4b.

Figure 14B:
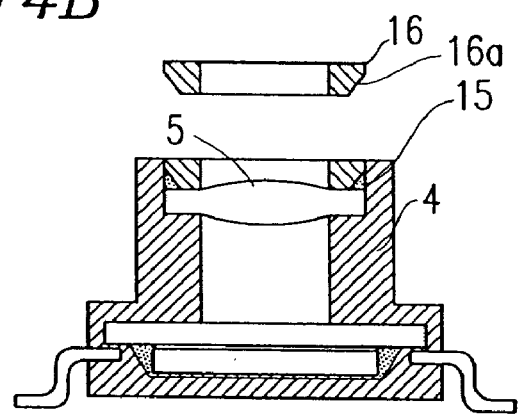

FIG. 14B shows a second exemplary method in which the adhesive 15 is applied to the lens 5 and the lens 5 is provided with a lid 16 having a taper 16a.

Figure 14C:
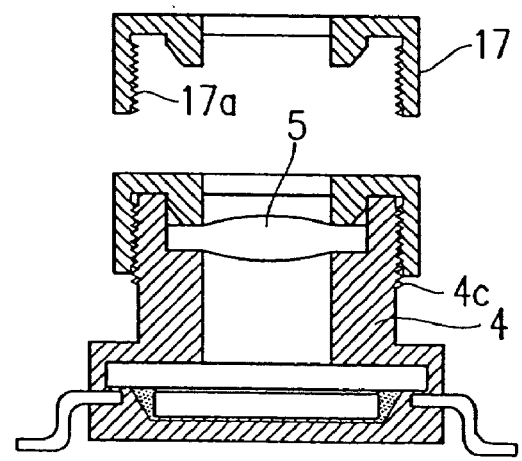

FIG. 14C shows a third exemplary method in which a male thread 4c is formed on the lens holder 4 and a cap 17 having a female thread 17a is screwed onto the lens holder 4.

Figure 15:
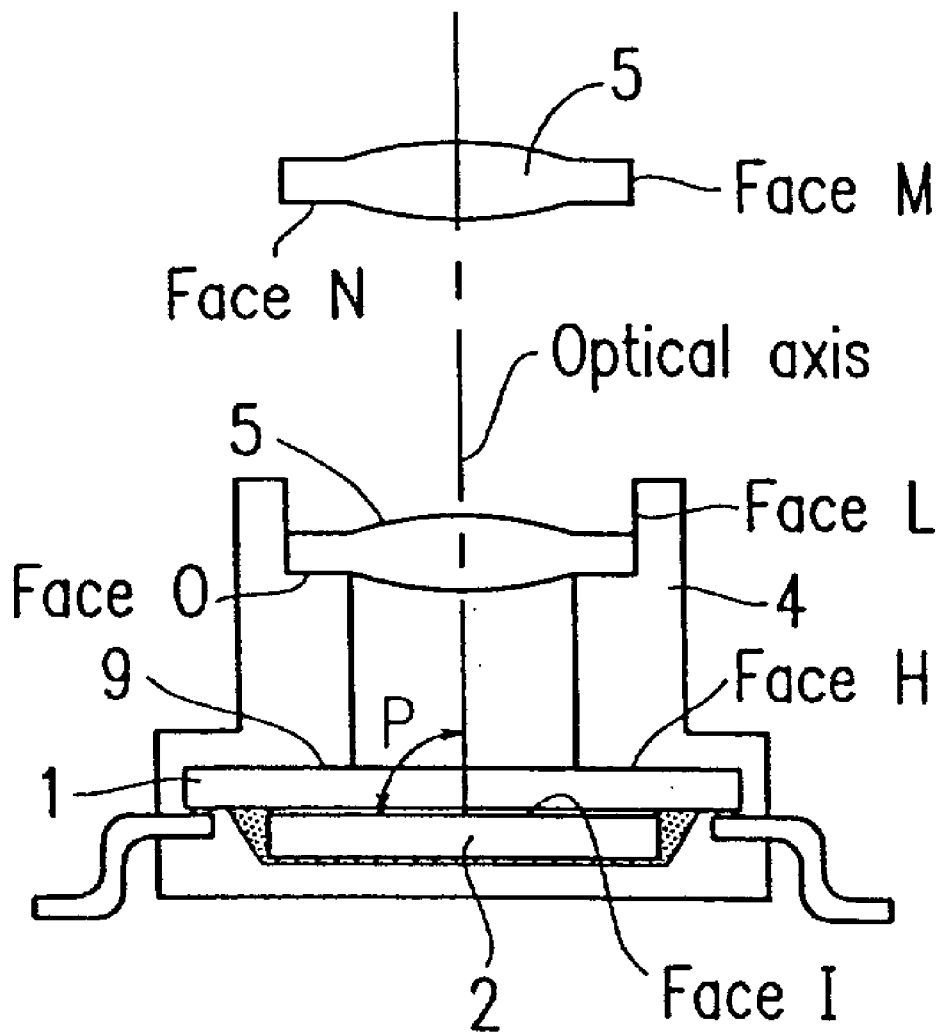
FIG. 15 is a cross-sectional view of the solid-state imaging device illustrating how a method for producing a solid-state imaging device according to the present invention can prevent deviation in an angle of an optical axis.

Referring to FIG. 15, all of the methods described above use a surface, substantially parallel to the light receiving surface 9 of the transparent substrate 1, along which the lens 5 is in contact with the lens holder 4 (face O) as a reference surface for mounting the lens 5 onto the lens holder 4. Any lens fixing method may be used for mounting of the lens 5 so long as a reference surface is used for assembling the solid-state imaging device 100.

A basic example of a method for producing a solid-state imaging device with an integral lens has been described. As described above, by using the first surface (face H in FIG. 15; light receiving surface) of the transparent substrate 1 as a reference surface for assembling the solid-state imaging device 100, a method for producing a solid-state imaging device with an integral lens of the present invention can produce the solid-state imaging device 100 with ease such that an angle (denoted as P in FIG. 15) formed by an optical axis of incident light and the light receiving surface (face I) of the solid-state imaging element 2 does not deviate from a right angle.

This is so, since the first surface (face H) of the transparent substrate 1 is used as a reference surface, the solid-state imaging element 2 is mounted on the second surface of the transparent substrate 1 so that the light receiving surface (face I) of the solid-state imaging element 2 is substantially parallel to the first surface (face H) of the transparent substrate 1. The lens holder 4 is formed such that the lens mounting surface (face O) is substantially parallel to face H. The lens 5 is placed into the lens holder 4 and is mounted on face O such that face N and face M are in contact with the face O and face L, respectively, so as to be fixed to the lens holder 4, as shown in FIG. 15. Thus, the solid-state imaging device can be produced with ease such that an angle (denoted as P in FIG. 15) formed by an optical axis of incident light and the light receiving surface (face I) of the solid-state imaging element 2 does not deviate from a right angle.

Figure 16A:
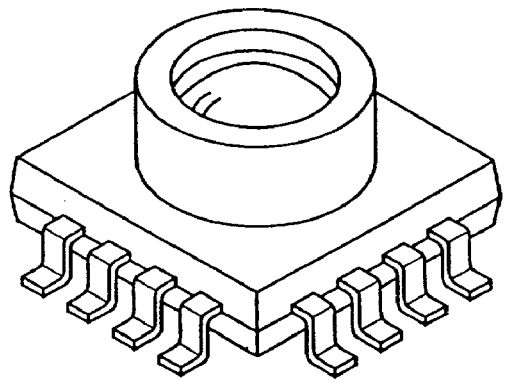
FIGS. 16A, 16B and 16C are each a perspective view illustrating an example of a solid-state imaging device which can be produced according to the present invention.
Figure 16B:
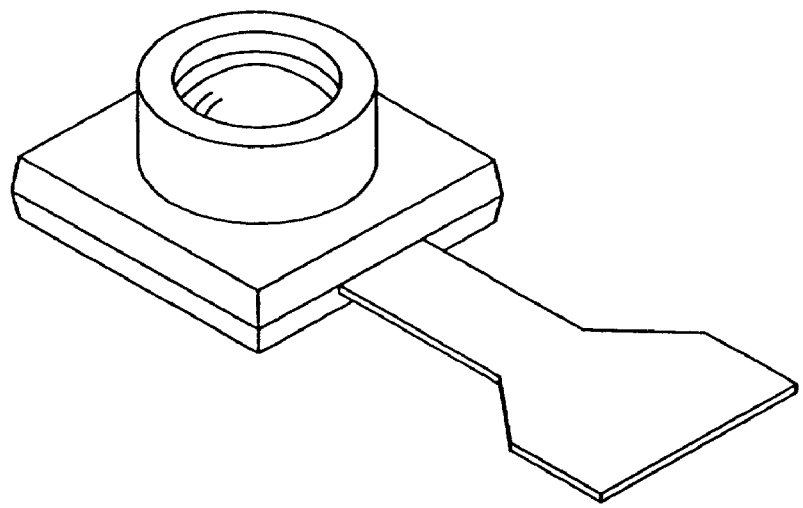
Figure 16C:
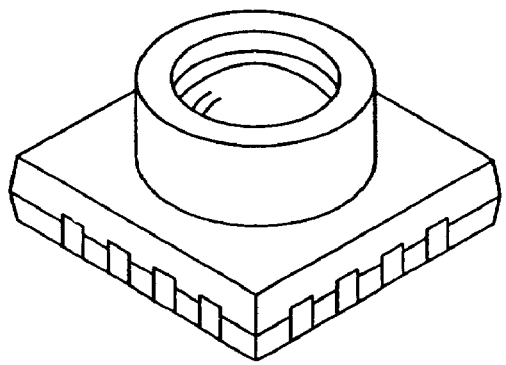
Figure 17A:
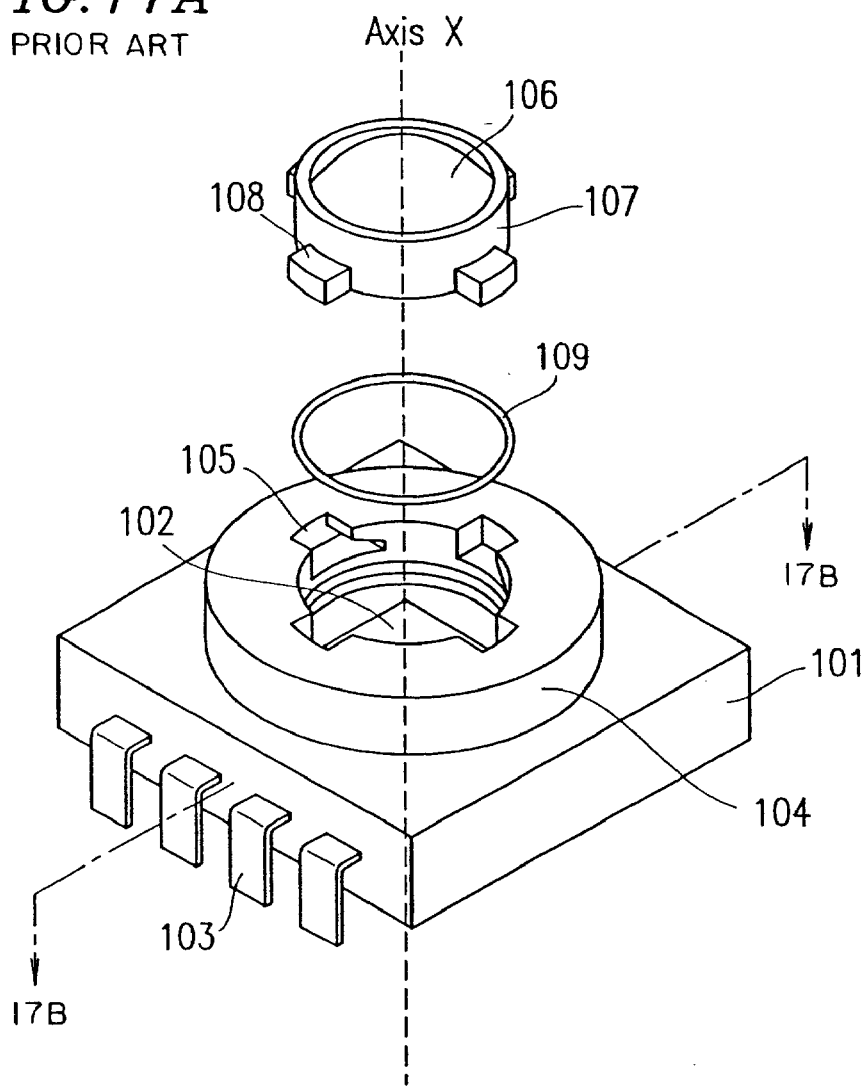
FIG. 17A is a schematic exploded perspective view showing a structure of a conventional solid-state imaging device.
Figure 17B:
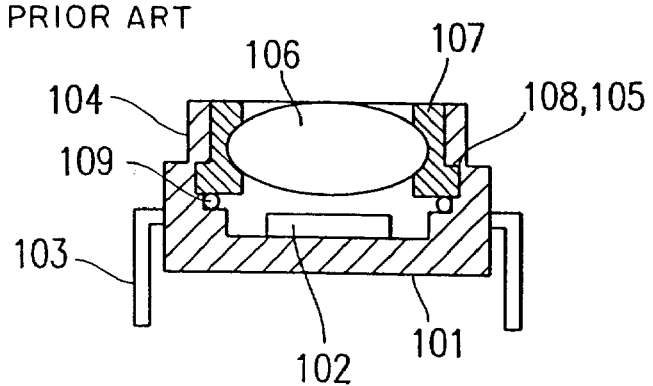
FIG. 17B is a cross-sectional view of the conventional solid-state imaging device shown in FIG. 17A taken along line A–A'.
Figure 18A:
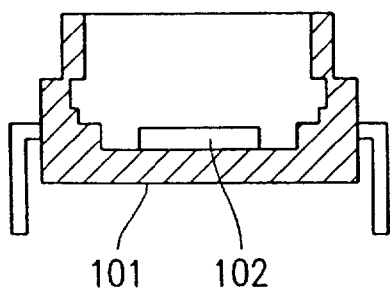
FIGS. 18A, 18B, 18C, 18D and 18E are each a view illustrating a problem of a conventional method for producing a solid-state imaging device.
Figure 18B:
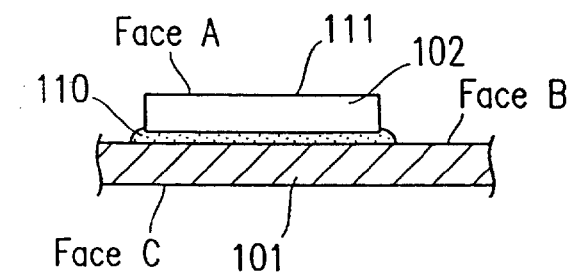
Figure 18C:
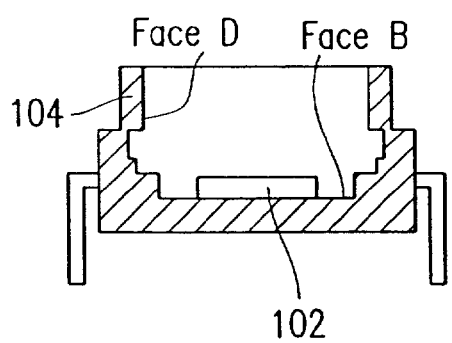
Figure 18D:
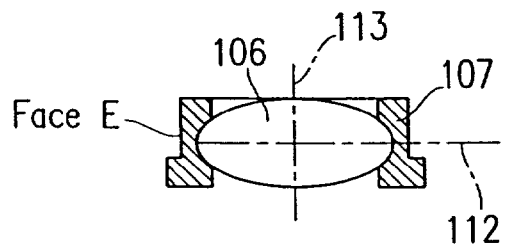
Figure 18E:
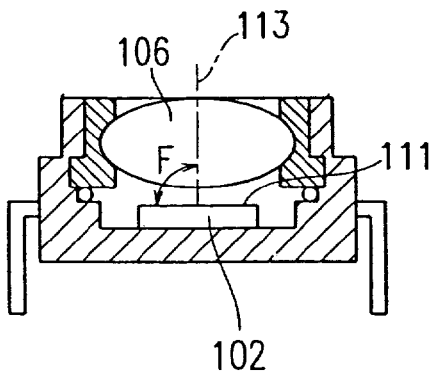

The present invention provides various types of solid-state imaging devices by varying a shape of the lead frame. Examples of a solid-state imaging device include a QFP (Quad Flat Gull-WingLead Package) type shown in FIG. 16A, an FPC (Flexible Printed Circuits) type shown in FIG. 16B, and a QFN (Quad Flat Non-Leaded Package) type shown in FIG. 16C.

As described above, the present invention can prevent an angle formed by an optical axis of incident light and the light receiving surface of the solid-state imaging element 2 from deviating from a right angle by using an easy and highly productive production method, in which a small number of parts are used for assembling the solid-state imaging device. Therefore, in circumstances where products incorporating a solid-state imaging device are expected to be smaller and thinner in the future, a high quality and less expensive solid-state imaging device can be provided to meet such circumstances.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a solid-state imaging device, comprising:
    a first step of mounting a solid-state imaging element on a transparent substrate having a first surface and a second surface opposite to the first surface such that a light receiving surface of the solid-state imaging element is substantially parallel to the first surface and faces the second surface; and
    a second step of forming a lens holder on the first surface, the lens holder having a lens mounting surface substantially parallel to the first surface.

2. A method for producing a solid-state imaging device according to claim 1, wherein the first step is performed by an ultrasonic wave connection technique.

3. A method for producing a solid-state imaging device according to claim 1, wherein the second step is performed by injecting resin into a mold.

4. A method for producing a solid-state imaging device according to claim 3, wherein the lens holder is formed integrally with a package.

5. A method for producing a solid-state imaging device according to claim 3, wherein the first surface of the transparent substrate is adsorbed airtight to the mold by vacuum suction.

6. A method for producing a solid-state imaging device according to claim 3, wherein an O-ring is placed in the mold so as to be in contact with the mold and the first surface of the transparent substrate before injecting the resin into the mold.

7. A method for producing a solid-state imaging device according to claim 1, further comprising the step of covering the solid-state imaging element with a resin between the first step and the second step.

8. A method for producing a solid-state imaging device according to claim 1, further comprising the step of attaching leads for input and output of an electric signal to the transparent substrate between the first step and the second step.

9. A method for producing a solid-state imaging device according to claim 7, further comprising the step of attaching leads for input and output of an electric signal to the transparent substrate after the step of covering the solid-state imaging element with the resin but before the step of performing the second step.

10. A method for producing a solid-state imaging device according to claim 1, wherein the transparent substrate is an optical filter.

* * * * *